United States Patent
Gleich et al.

(10) Patent No.: US 11,994,567 B2
(45) Date of Patent: May 28, 2024

(54) PRESSURIZED GAS POWERED MAGNETIC RESONANCE IMAGING DATA

(71) Applicant: KONINKLIJKE PHILIPS N.V., Eindhoven (NL)

(72) Inventors: Bernhard Gleich, Hamburg (DE); Steffen Weiss, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 106 days.

(21) Appl. No.: 17/607,092

(22) PCT Filed: Apr. 28, 2020

(86) PCT No.: PCT/EP2020/061746
§ 371 (c)(1),
(2) Date: Oct. 28, 2021

(87) PCT Pub. No.: WO2020/221735
PCT Pub. Date: Nov. 5, 2020

(65) Prior Publication Data
US 2022/0229128 A1  Jul. 21, 2022

(30) Foreign Application Priority Data
Apr. 30, 2019 (EP) .................... 19171733

(51) Int. Cl.
*G01R 33/34* (2006.01)
*G01R 33/385* (2006.01)
*H02K 7/18* (2006.01)

(52) U.S. Cl.
CPC ....... *G01R 33/3403* (2013.01); *G01R 33/385* (2013.01); *H02K 7/1823* (2013.01)

(58) Field of Classification Search
CPC .............. G01R 33/3403; G01R 33/385; G01R 33/3415; G01R 33/3692; G01R 33/36; H02K 7/1823
See application file for complete search history.

(56) References Cited

U.S. PATENT DOCUMENTS 10,036,272 B2  7/2018  Somani et al.
10,175,313 B2  1/2019  Okamoto
(Continued)

FOREIGN PATENT DOCUMENTS

DE    4200992 A1    7/1993
GB    2375147 A    11/2002
(Continued)

OTHER PUBLICATIONS

Anonymous "Antriebskonzepte fur Hohe Magnetfeldumgebungen" Jun. 2016 Research Disclosure Publication (no translation available).
(Continued)

*Primary Examiner* — G. M. A Hyder

(57) ABSTRACT

A magnetic resonance imaging antenna (114) comprising one or more coil elements (115) is disclosed. The magnetic resonance imaging antenna further comprises a radio frequency system (116) coupled to the one or more coil elements. The magnetic resonance imaging antenna further comprises a gas inlet (200) configured for receiving a pressurized gas. The magnetic resonance imaging antenna further comprises a gas outlet (202) configured for venting the pressurized gas. The magnetic resonance imaging antenna further comprises an electrical generator (117) configured for converting mechanical energy resulting from passing the pressurized gas from the gas inlet to the gas outlet into electricity while in the presence of an external
(Continued)

magnetic field. The electrical generator is configured to power the radio frequency system using the electricity.

15 Claims, 11 Drawing Sheets

(56) References Cited

U.S. PATENT DOCUMENTS

| | | |
|---|---|---|
| 2010/0024445 A1 | 2/2010 | Cichanowicz |
| 2011/0009730 A1* | 1/2011 | Varjo ................. G01R 33/3692 324/318 |
| 2015/0272818 A1 | 10/2015 | Fontaine et al. |

FOREIGN PATENT DOCUMENTS

| | | |
|---|---|---|
| KR | 20100120393 A | 11/2010 |
| WO | 2009069098 A2 | 6/2009 |
| WO | 2014026897 A1 | 2/2014 |
| WO | 2015179158 A1 | 11/2015 |

OTHER PUBLICATIONS

Kupfer-Beryllium Legierungen Technische Information Bush Wellman Engineering Materials (no translation available).
International Search Report and Written Opinion from PCT/EP2020/061746 dated Nov. 5, 2020.

* cited by examiner

PRESSURIZED GAS POWERED MAGNETIC RESONANCE IMAGING DATA

CROSS REFERENCE TO RELATED APPLICATIONS

This application is a U.S. national phase application of International Application No. PCT/EP2020/061746 filed on Apr. 28, 2020, which claims the benefit of EP Application Serial No. 19171733.9 filed on Apr. 30, 2019. The disclosures of International Application No. PCT/EP2020/061746 and of EP Application Serial No. 19171733.9 are specifically incorporated herein by reference.

FIELD OF THE INVENTION

The invention relates to magnetic resonance imaging, in particular to the antennas for magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field. Various quantities or properties of the subject can be measured spatially using MRI such as the proton density or various relaxation times such as the T1, T2, or T2-star values.

In addition to using a B0 field, there are also antennas which are used to transmit and receive Radio Frequency (RF) signals. The transmitted RF signals (the B1 field) are used to manipulate the orientation of the spins. The received RF signals (recorded as the magnetic resonance imaging data) are received from the spins and is used to reconstruct a magnetic resonance image. When receiving the RF signals it is beneficial to place electronics such as preamplifiers and digitizers as close as possible to the respective antenna elements. However, the presence of large magnetic and RF fields can make the powering of these circuits difficult.

United States patent publication U.S. Pat. No. 10,175,313 B2 discloses an MRI apparatus includes a power transmitting unit, a signal receiving unit and an image reconstruction unit. The power transmitting unit wirelessly transmits electric power to an RF coil device by magnetically coupled resonant type wireless power transfer. The signal receiving unit wirelessly receives a digitized nuclear magnetic resonance signal wirelessly transmitted from the RF coil device. The image reconstruction unit obtains a nuclear magnetic resonance signal received by the signal receiving unit, and reconstructs image data of an object on the basis of the nuclear magnetic resonance signal.

SUMMARY OF THE INVENTION

The invention provides for a magnetic resonance imaging antenna and a magnetic resonance imaging system.

As mentioned above it can be difficult to provide power to electronic circuits within an imaging zone of a magnetic resonance imaging system. Embodiments of the invention may provide for an improved means of powering a magnetic resonance imaging antenna by using an electric generator that is powered by a compressed gas. This has the advantage that there are no electrical leads which need to be protected from RF signals within the magnetic resonance imaging system. Additionally, the presence of the $B_0$ field eliminates the need for an electrical generator to have its own magnets.

The use of a compressed gas enables the generator to be powered as needed and to be constantly supplied even during long magnetic resonance imaging examinations. This may eliminate the need to have a battery or capacitor store energy to power the magnetic resonance imaging antenna.

In one aspect the invention provides for a magnetic resonance imaging antenna that comprises one or more coil elements. The magnetic resonance imaging antenna further comprises a radio-frequency system that is connected to the one or more coil elements. The magnetic resonance imaging antenna further comprises a gas inlet configured for receiving a pressurized gas. The magnetic resonance imaging antenna further comprises a gas outlet configured for venting the pressurized gas. The magnetic resonance imaging antenna further comprises an electrical generator configured for converting mechanical energy resulting from passing the pressurized gas from the gas inlet to the gas outlet into electricity around the presence of an external magnetic field.

The electrical generator is configured to power the magnetic resonance imaging antenna, including the radio frequency system, using the electricity. Depending upon the configuration the magnetic resonance imaging antenna may comprises components such as: tune/detune circuits, AD converters, DA converters, digital to digital optical converters, sensors, and/or other electrical accessories. They may all be powered by the electrical generator.

The electrical generator is unique in that it does not have its own magnet. The magnetic resonance imaging systems typically comprise a main magnet that produces a large magnetic field which is necessary for performing magnetic resonance imaging. The external magnetic field may be the main magnetic field of the magnetic resonance imaging system. This embodiment may be advantageous because it provides a means of supplying power to the magnetic resonance imaging antenna which is completely compatible with the large magnetic and radio-frequency fields that are present in magnetic resonance imaging systems. It may avoid the problems and difficulties in charging a battery or capacitor to power a magnetic resonance imaging antenna.

In another embodiment the electrical generator comprises a turbine configured for being rotated by the pressurized gas passing from the gas inlet to the gas outlet. The turbine is configured for rotating a conductive element. The conductive element is configured for generating electricity when being rotated in the external magnetic field. This embodiment may be beneficial because it provides a straight forward means of providing electrical power to the radio-frequency system.

In another embodiment the conductive element is a conductive loop. For example, as the loop is rotated by the turbine it may function as an electric generator.

In another embodiment the turbine comprises paddles. The conductive lop is attached to at least two of the paddles. For example, the conductive loop may be integrated into the paddles of the turbine. This may be beneficial because it may reduce the size of the turbine and make it more compact. Incorporating the conductive loop into the paddles may also make them more durable.

In another embodiment the electrical generator comprises a switching circuit in series with the conductive loop. The switching circuit is configured for being powered by the conductive loop. The switching circuit is configured for electrically opening and electrically closing the conductive loop at a predetermined frequency. The electrical generator further comprises one or more stationary pick-up coils configured for receiving electrical energy switched at the predetermined frequency. The at least one stationary pick-up coil is configured for powering the radio-frequency system. This embodiment may be beneficial because it may eliminate the need for brushes in the electric generator. Also, by using a circuit to open and close the loop at a predetermined frequency, a frequency can be chosen which is for example very efficient and outside of the range used for the magnetic resonance imaging procedure. For example, 1 MHz would be very efficient in transferring energy from the conductive loop to the stationary pick-up coils. 10 MHz may function even better.

In another embodiment the electrical generator comprises brushes for supplying the electricity from the conductive loop to the radio-frequency system.

In another embodiment the turbine has a rotational axis. The conductive element is asymmetric about the rotational axis. The electrical generator further comprises one or more stationary pick-up coils. The stationary pick-up coils are configured for receiving electrical energy caused by rotation of the conductive element. The at least one stationary pick-up coil is configured for supplying the electricity to the radio-frequency system. In this embodiment the object which is asymmetric about the rational axis could have the effect of having eddy currents when it is rotated. These eddy currents may produce a radio-frequency field which can be picked up by the stationary pick-up coils. For example, a plate-like structure can be rotated. This for example may not be as efficient as using loops but it is however an extremely durable option.

In another embodiment the turbine comprises a rotor. The rotor has a diameter less than 2 mm and, in some cases, less than 1 mm. The use of a rotor which is less than 2 mm or 1 mm means that the rotor could have a very high rotation rate. This means that noise generated by it could be above the audible range.

In another embodiment the turbine is configured to have a rotational rate of at least 1.2 million rotations per minute. This embodiment may be beneficial because the noise generated by the turbine could then be above 20,000 Hz, which is above the hearing range of the typical human.

In another embodiment the magnetic resonance imaging antenna comprises multiple turbines. For example, the turbines may be mounted such that their rotational axes are orthogonal to each other. This may be useful in the case where the magnetic resonance imaging antenna could be placed into different orientations with respect to a magnetic resonance imaging magnet. Having multiple turbines may have the advantage that regardless of the position of the magnetic resonance imaging antenna it is still able to generate the electricity for powering the radio-frequency system.

In another embodiment the electrical generator comprises a resonant cavity configured for generating acoustic resonances in response to the passage of pressurized gas from the gas inlet to the gas outlet. The electrical generator further comprises a mechanical member configured for vibrating in response to the acoustic resonances. The mechanical member is suspended within the resonant cavity. The electrical generator further comprises at least one electrically conductive path configured such that the movement of the mechanical member causes the generation of electricity in the external magnetic field. This for example may take different forms. In some examples the electrically conductive path travels at least partially over the mechanical member so that as the mechanical member moves in the external magnetic field it causes a generation of electricity in the at least one electrically conductive path.

In other examples the mechanical member may for example have a torsional or rotational movement in the resonant cavity and its movement within the magnetic field may cause a radio-frequency disturbance which can be picked up and, in this case, the at least one electrically conductive path is a pick-up coil used to collect this electricity.

In another embodiment the resonant cavity is a whistle to an ultrasonic frequency. This embodiment may be beneficial because the resonant cavity can then be constructed such that it is not able to be heard by a typical human.

In another embodiment the mechanical member comprises a conductive element. The conductive element is configured to vibrate with a rotational component and/or torsionally. The vibration of the mechanical member rotationally and/or torsionally may be equivalent to a partial or rotational movement. This may cause a disturbance in the electromagnetic field. The at least one conductive path is one or more stationary pick-up coils configured for receiving electrical energy generated by the vibration of the conductive element.

The at least one stationary pick-up coil is configured for supplying electricity to the radio-frequency system. This embodiment may be beneficial because it does not require any electrical connection between the mechanical member and the at least one stationary pickup coil. For example, when the mechanical member becomes worn out it may be possible to replace this part without making any changes in the electrical circuit of the magnetic resonance imaging antenna.

In another embodiment each of the at least one conductive path is at least partially on the mechanical member. As the mechanical member vibrates the area enclosed by the conductive path could change because when the magnetic resonance imaging antenna is placed in an external magnetic field such as the field from a magnetic resonance imaging system, this movement of the conductive path on the mechanical member could result in the generation of the electricity. Another way of saying this is that as each of the at least one conductive path is configured such that movement of the mechanical member causes an area enclosed by the conductive path to change.

In another embodiment the at least one electrically conductive path is two conductive paths. The two conductive paths are electrically isolated. When the two conductive paths are configured the two conductive paths are configured for generating electricity independently. For example, the mechanical member could be placed such that two orthogonal areas each enclosed by an electrically conductive path can be defined. This may enable the electrical generator to function regardless of the orientation with respect to the magnetic field of the magnetic resonance imaging system.

In another embodiment the electrical generator is arranged such that the pressurized gas passing from the gas inlet to the gas outlet cools the radio-frequency system. For example, the electrical generator may also function as heat sink. This may be beneficial because it may provide for an effective means of reducing the amount of heat near the subject during a magnetic resonance imaging examination.

In another embodiment the radio-frequency system comprises a receiver coupled to at least a portion of the one or more coil elements.

In another embodiment the radio-frequency system further comprises a transmitter coupled to at least a portion of the one or more coil elements. For example, the coil could function as a transmitter, a receiver or a transceiver.

In another embodiment the magnetic resonance imaging antenna comprises a fiber optic communication system configured for controlling the radio-frequency system. This may be useful because the fiber optics do not interfere with the electric or magnetic fields that are present during the magnetic resonance examination.

In another embodiment the magnetic resonance imaging antenna comprises a wireless communication system configured for controlling the radio-frequency system. This may be beneficial because it may provide for a means of illuminating wires that run to and from the magnetic resonance imaging antenna.

In another aspect the invention provides for a magnetic resonance imaging system that comprises the magnetic resonance imaging antenna according to an embodiment. The magnetic resonance imaging system comprises a main magnet. The main magnet is configured for generating the external magnetic field. The magnetic resonance imaging system further comprises a pressurized gas system for providing pressurized gas to the magnetic resonance imaging coil. This embodiment may be beneficial because the magnetic resonance imaging system provides the pressurized gas as well as the external magnetic field which is needed by the generator to produce the electricity.

In another embodiment the magnetic resonance imaging system further comprises a memory which stores machine-executable instructions and pulse sequence commands. The pulse sequence commands are configured for controlling the magnetic resonance imaging system to acquire magnetic resonance imaging data using the magnetic resonance imaging antenna. The magnetic resonance imaging system further comprises a processor configured for controlling the magnetic resonance imaging system.

Execution of the machine-executable instructions causes the processor to acquire the magnetic resonance imaging data by controlling the magnetic resonance imaging system with the pulse sequence commands. Execution of the machine-executable instructions further cause the processor to power the magnetic resonance imaging coil by controlling the pressurized gas system to supply the pressurized gas during the acquisition of the magnetic resonance imaging data.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid-state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. MRF magnetic resonance data is magnetic resonance data. Magnetic resonance data is an example of medical image data. A Magnetic Resonance Imaging (MRI) image or MR image is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
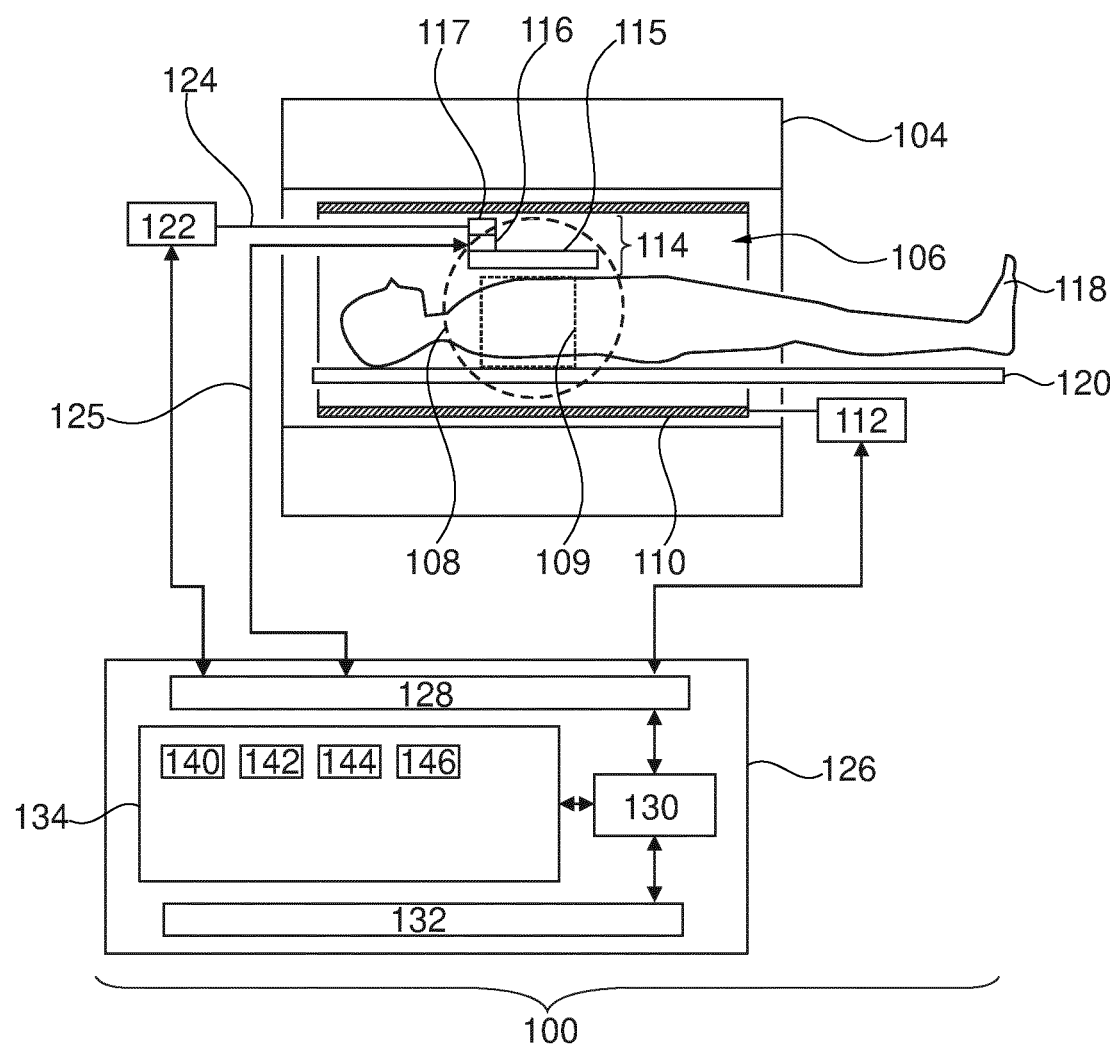
FIG. 1 illustrates an example of a magnetic resonance imaging system.

FIG. 1 shows an example of a magnetic resonance imaging system 100 with a magnet 104. The magnet 104 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the magnet 104 there is an imaging zone 108 where the magnetic field is strong and uniform enough to perform magnetic resonance imaging. A region of interest 109 is shown within the imaging zone 108. The magnetic resonance data that is acquired typically acquired for the region of interest. A subject 118 is shown as being supported by a subject support 120 such that at least a portion of the subject 118 is within the imaging zone 108 and the region of interest 109.

Within the bore 106 of the magnet there is also a set of magnetic field gradient coils 110 which is used for acquisition of preliminary magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Within the imaging zone 108 a magnetic resonance imaging antenna 114 is visible. The magnetic resonance imaging antenna 114 comprises one or more coil elements 115, a radio-frequency system 116, and an electrical generator 117. The radio-frequency system 116 is coupled to the coil elements 115 and may function as a receiver and/or transmitter in different examples. The magnetic resonance imaging antenna 114 is connected to a computer system 126 via a fiber optic connection 125 or communication system. The fiber optic connection 125 may be used to exchange digital information between the computer system 126 and the magnetic resonance imaging antenna 114. The fiber optic connection 125 may for example be replaced with a wireless connection such as a Wi-Fi network or Bluetooth connection.

The magnetic resonance imaging antenna may be a transmit and/or a receive coil.

Outside of the magnet 104 there is a pressurized gas system 122. There is a gas line 124 between the pressurized gas system 122 and the electrical generator 117. The pressurized gas provides gas pressure to the electrical generator 117 which converts this into electricity for powering the radio-frequency system 116. The magnetic resonance imaging antenna 114 may also have multiple receive/transmit elements that can send and/or recive on separate channels. The sub antenna for each of theses channels are referred to herein as coil elements.

The magnetic resonance imaging antenna 114, the magnetic field gradient coil power supply, and the pressurized gas system 122 are shown as being connected to a hardware interface 128 of the computer system 126. The computer system further comprises a processor 130 that is in communication with the hardware interface 128, a memory 134, and a user interface 132. The memory 134 may be any combination of memory which is accessible to the processor 130. This may include such things as main memory, cached memory, and also non-volatile memory such as flash RAM, hard drives, or other storage devices. In some examples the memory 134 may be considered to be a non-transitory computer-readable medium.

The memory 134 is shown as containing machine-executable instructions 140. The machine-executable instructions 140 enable the processor 130 to perform various control tasks for the magnetic resonance imaging system 100 as well as perform various numerical and image processing tasks. The memory 134 is further shown as containing pulse sequence commands 142. The pulse sequence commands may be commands or data which is converted into such commands which enable the processor 130 to control the magnetic resonance imaging system 100 to acquire magnetic resonance imaging data. The memory 134 is further shown as containing magnetic resonance imaging data 144 that has been acquired by controlling the magnetic resonance imaging system 100 with the pulse sequence commands 142. The memory 134 is further shown as containing a magnetic resonance image 146 that has been reconstructed from the magnetic resonance imaging data 144.

Figure 2:
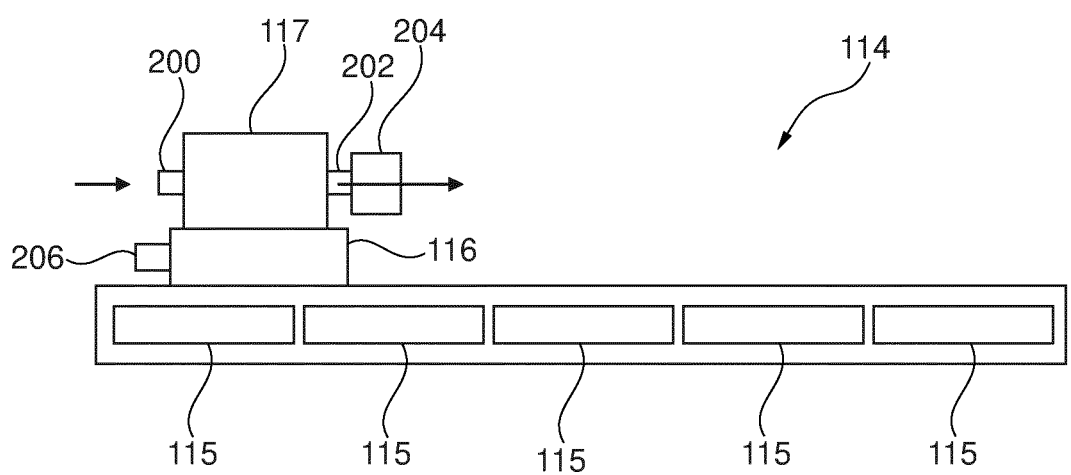
FIG. 2 illustrates an example of a magnetic resonance imaging antenna.

FIG. 2 shows a more detailed view of the magnetic resonance imaging antenna 114 that is present in FIG. 1. The magnetic resonance imaging antenna 114 is shown as comprising a number of coil elements 115. These coil elements 115 are coupled to the radio-frequency system 116. Depending on the particular example the radio-frequency system 116 may be a transmitter and/or receiver. The radio-frequency system 116 is shown as having an optional communication system 206. The communication system 206 may for example be a connection for a fiber optic or for a wireless communication system such as Wi-Fi. This may enable the magnetic resonance imaging antenna 114 to be controlled without the use of a wired connection.

On top of the radio-frequency system 116 is the electrical generator 117. The electrical generator 117 has a gas inlet 200 and a gas outlet 202. Pressurized gas enters the gas inlet 200 and exits through the gas outlet 202. The mechanical work performed by this is converted into electricity by the electrical generator 117. In this example there is an optional muffler 204 which is attached to the gas outlet 202. This may for example be useful in reducing the amount of acoustic noise which is audible from the electrical generator 117.

Figure 3:
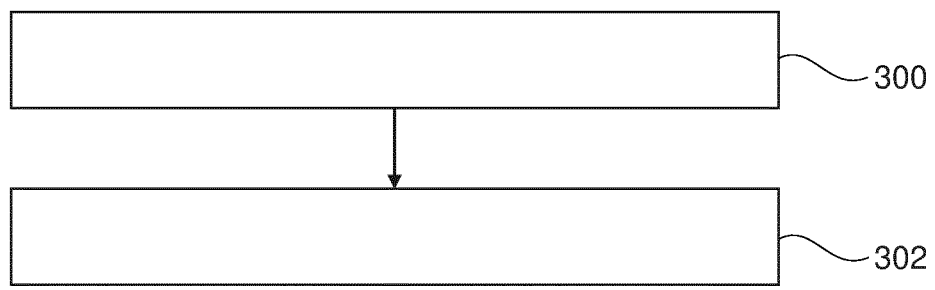
FIG. 3 shows a flow chart which illustrates a method of operating the magnetic resonance imaging system of FIG. 1.

FIG. 3 shows a flowchart which illustrates a method of operating the magnetic resonance imaging system 100 of FIG. 1. First in step 300 the magnetic resonance imaging data 144 is acquired by controlling the magnetic resonance imaging system 100 with the pulse sequence commands 142. Next in step 302 the magnetic resonance imaging antenna 114 is powered by controlling the pressurized gas system 122 to supply a pressurized gas during the acquisition of the magnetic resonance imaging data 144.

Figure 4:
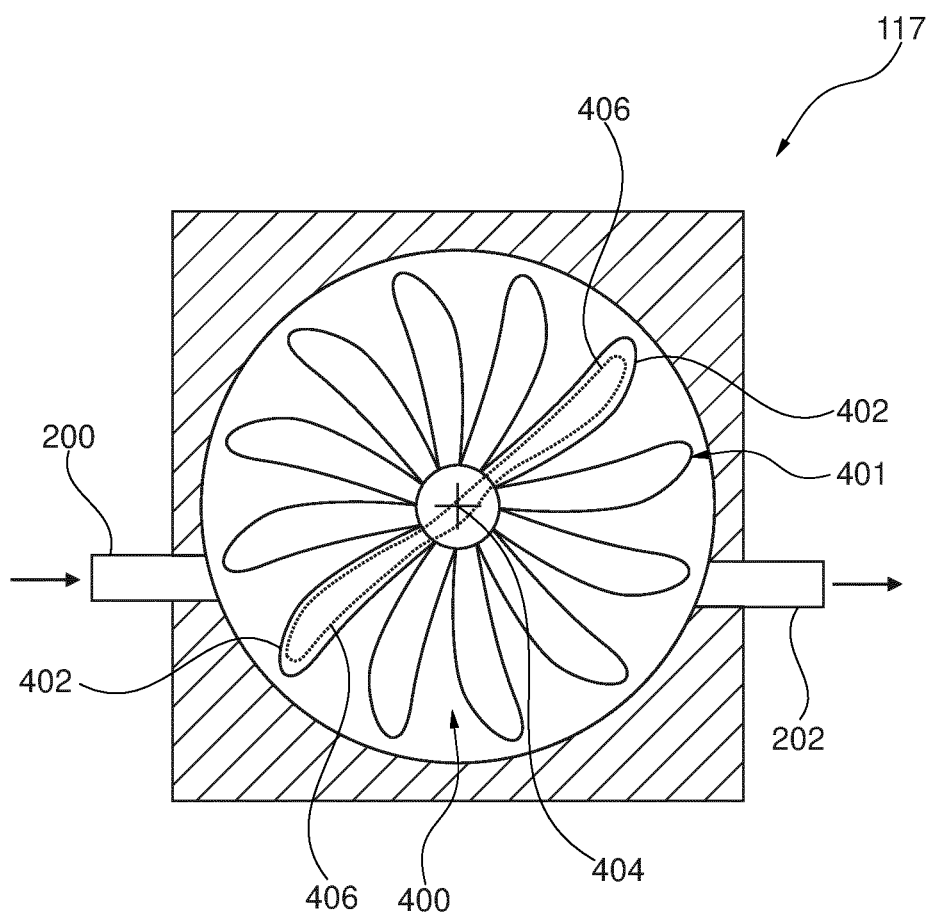
FIG. 4 illustrates an example of an electrical generator.

FIG. 4 illustrates one example of an electrical generator 117. In this example the electrical generator 117 comprises a turbine 400 with a rotor 401. Pressurized gas entering at the inlet and exiting at the gas outlet 202 causes the turbine 400 to rotate. It rotates about a rotational axis 404. The turbine 400 comprises a number of paddles 402, which may be opposing. Within two opposing paddles 402 there is a conductive loop 406. As the paddles 402 rotate there is a current generated into the conductive loop 406. In the example shown in FIG. 4 for example brushes may be used to make an electrical connection with the conductive loop 406 and provide electricity to the radio-frequency system.

Figure 5:
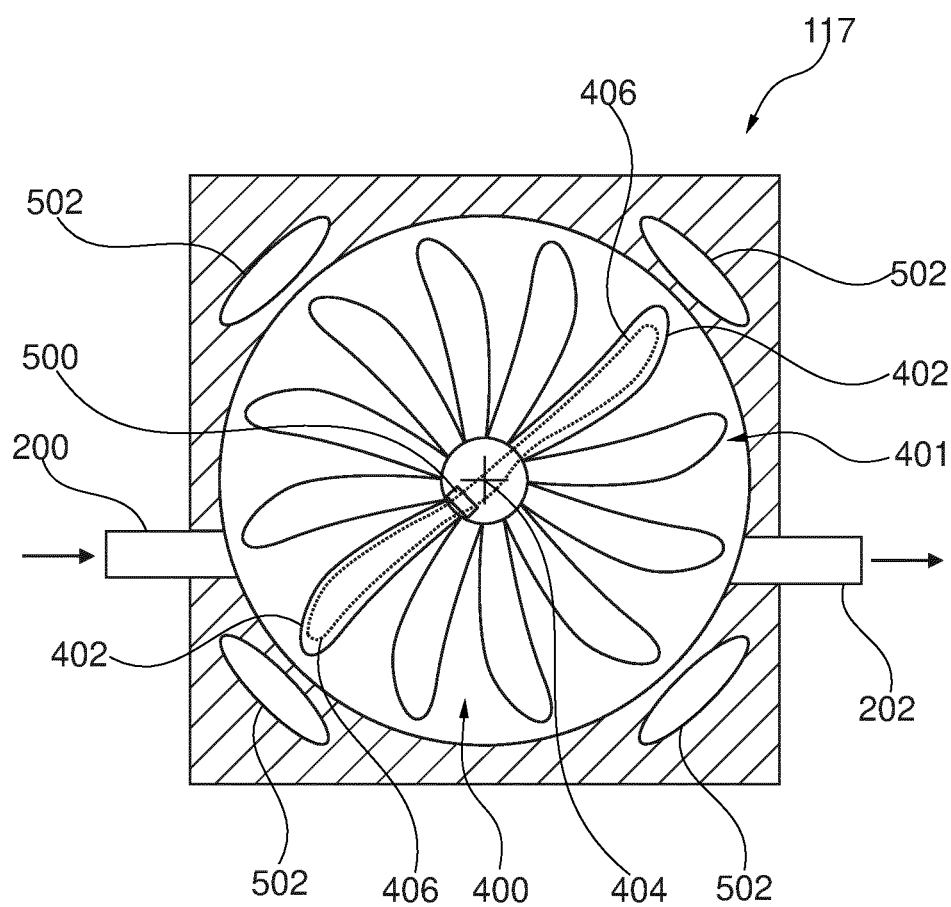
FIG. 5 illustrates a further example of an electrical generator.

FIG. 5 shows an alternative electrical generator 117. The example in FIG. 5 is similar to that in FIG. 4 except the version in FIG. 4 does not need brushes. In this example the conductive loop 406 is connected to a switching circuit 500 that is configured for electrically connecting and disconnecting the conductive loop 406. This causes an oscillating electromagnetic field that may be picked up using stationary pick-up coils 502. The stationary pick-up coils 502 are shown as being embedded in a housing of the electrical generator 117.

The conductive loop 406 powers the switching circuit 500. This for example may be beneficial because it enables not only brushless communication but also the electromagnetic energy generated by the electrical generator 117 may be arbitrarily chosen by setting the switching circuit 500 to switch at a predetermined frequency. A frequency such as 1 MHz or 10 MHz may be chosen such that it efficiently transfers electrical power as well as avoiding noise in the frequency band used for magnetic resonance imaging.

Figure 6:
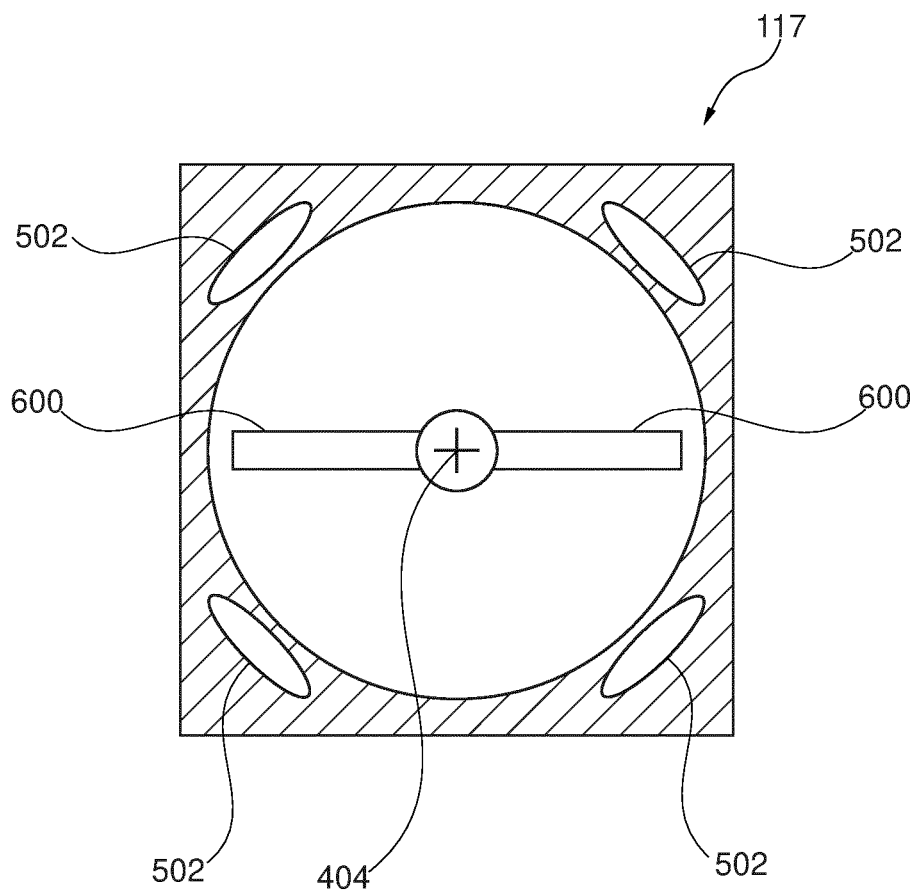
FIG. 6 illustrates a further example of an electrical generator.

FIG. 6 shows a further alternative of an electrical generator 117. The view in FIG. 6 does not show the turbine, however, the structure shown is connected to the turbine. In this example the turbine causes a conductive plate 600 to rotate about the rotational axis 404. In the presence of a magnetic field this causes eddy currents which then produce an electromagnetic field which can then be picked up by the stationary pick-up coils 502. The example shown in FIG. 6 has a disadvantage that the frequency of the electromagnetic radiation is set by the rotational speed of the turbine. However, the example shown in FIG. 6 has a huge advantage of its mechanical simplicity. The design is very robust and does not need any additional electrical components in the rotor.

Optional or supplementary MRI coils, such as surface coils, head coils, or other specialized coils are almost always used in Magnetic resonance imaging. While the handling of the coils is simple, the connecting cable is bulky. The reason for this is the need of high frequency traps to make the cable safe for the patient.

To avoid the bulky cable, pure wireless technologies have been proposed. Powering with batteries is feasible, but makes the coils heavy and/or hazardous. Wireless power transmission at Larmor frequency or higher does not seem to be feasible, while at lower frequencies it makes the coil heavy and rigid. There exist also concepts for powering over a thin cable using high frequency signals. These concepts suffer from low efficiency and hence undesirable coil heating.

Embodiments may provide for a means to transmit power to the magnetic resonance imaging coil (i.e. an MRI receive coil) using compressed air or other pressurized gas. The air may be expanded at the coil using some sort of turbine. Attached (or integrated) to the turbine may be a generator utilizing the main magnetic field as stator field. So no ferromagnetic material may be needed and the turbine/generator unit is expected to have a mass below 2 grams and 1 cm 3 volume for a 16 element coil. The air flow is expected to be about 0.5 l/s at atmospheric pressure. This means the compressed air flow at 10 atmospheres is only 50 ml/s. The mass flow could be quite close to the breathing action of a human, so it is feasible to dampen the noise emissions to a very low level. The gas flow may provide an efficient means of cooling, keeping the coil always exactly at ambient temperature.

The energy generated by the adiabatic expansion of a diatomic gas is $$E = \frac{5}{2}nRT\left(\left(\frac{P_1}{P_2}\right)^{1.4} - 1\right)$$

(n: molar amount of molecules; R general gas constant; T absolute temperature; P pressures)

With a pressure ratio of 10, to generate 50 W of power at room temperature, a flux of about 0.02 mol/s is needed i.e. about 0.5 l/s of exhaust flow (similar to human breathing action). The 50 W may be enough to power a 16 element coil even taking efficiencies into account. During the expansion, the gas flow cools considerably. From about 300 K start to roughly 150 K end temperature. But when taking all losses into account, there should be sufficient power available to bring the gas back to 300 K. There may be no risk for the patient and also the problem of coil heating is solved. However, it may be beneficial to use only well dried air to avoid turbine clocking.

Typical material strength in common engineering material allow 100 m/s turbine blade tip velocities while still having sufficient safety margins. At a turbine diameter of 1 cm, this translates to a frequency of 3.1 kHz. A single loop coil mounted on the Turbine with an area of 1 cm 2 could generate a peak voltage of 2.9 V in a 1.5 T external field. Assuming a copper area of 1 mm$^2$, the coil resistance could be about 5 mOhm and hence the short circuit power about 800 W. This may be more than the available power from the turbine. By reducing the current, it may be therefore possible to extract the energy with quite high efficiency and a very low mass of copper used (<400 mg). The copper can be distributed over more windings and/or coils to adjust the voltage and to smooth the wave form.

Efficient fast rotation turbine designs may be used. An inexpensive example is the simple Tesla turbine having rather low efficiency to a multi stage axial turbine. A bladed axial design may offer a good compromise between efficiency and simplicity. On such a design, the coil(s) (conductive loop) can be wound easily on the rotor or blades of the rotor.

It is not expected that this type of power supply could negatively affect the MR imaging. The rotor and turbine housing may be made of non-magnetic material, like high strength plastic and ceramics. The currents in the coils may not be higher than the usual feed currents in classical power supplies. Therefore, the image may not be distorted more than in current designs.

The electrical generator can be constructed such that the acoustic noise generated in the design has very high frequency. High frequency acoustic noise may be reasonable well absorbed using fibers/cloth or using a muffler. The turbine could be packed in fiber material and all exhaust air may pass through dense fiber material. It is feasible to have some pressure drop through the material and still generate enough power.

There may be plenty of quick lock pressurized air connectors available (e.g. from Festo). The outer diameter of the hose could be somewhere between 3 and 6 mm. The signals may be transmitted by glass fibers and the fibers pierce through the hose at the ends of the hose and goes to separate standard connectors. A sensor system may be used to depressurize the hose, if an unplugging action is attempted to avoid the generation of acoustic bangs.

The exhaust may be handled by letting it escape from multiple cloth covered holed distributed over the surface of the magnetic resonance imaging coil.

There is a trend towards more flexible and higher channel-count MRI coils. However, as was mentioned above, the connecting cables with RF traps remain bulky and rigid and require careful routing for RF safety. Turbines may operate in the audio band, creating undesired noise directly at the patient. Here, whistles and similar oscillators (acoustic resonators) operated at ultrasound frequencies with pressurized air are proposed as alternative electrical generators. Voltages may be induced by $B_0$ field in conductive membranes oscillating in the acoustic cavity which is excited by the air flow, e.g. similar to whistling on a blade of grass. Besides being inaudible, such devices may avoid any macroscopically moving parts, bearings, and tight tolerances of the turbine concept. This makes them cheaper and more robust. The favorable cooling concept providing exactly as much local cooling power as electrical energy is dissipated locally by all loads is maintained, solving the cooling problem in MR coils.

The problem of powering and cooling of magnetic resonance imaging antennas increases with the number of channels (number of coil elements) because each pre-amplification/digitization/detuning unit adds dissipated energy. The air turbine proposal above elegantly solves this problem, because the energy conservation requires, that all energy that is generated by the thermodynamic engine during adiabatic expansion decreases the inner energy of the air. Hence, ignoring the small Joule-Thomson effect, the air provides exactly as much cooling "energy" as heat is dissipated by all connected electrical loads and during energy conversion (turbine bearings, generator).

The main problem of the turbine solution is that unless it is very small (with a rotor diameter of less than 2 mm) it is bound to the audio band, creating undesired high-pitched monotonous noise. Typical material strength in common engineering material allow 100 m/s turbine blade tip velocities. At a turbine diameter of 1 cm, this translates to a frequency of 3.1 kHz. Turbine diameters may still be reduced by a factor of three resulting in nearly 10 kHz, but it is difficult to reach 25 kHz and still realize an efficient energy conversion. However, such a frequency is beneficial because it may be inaudible and also safe for the human audible system.

In a magnetic resonance imaging antenna, the MR signal from each coil element (or channel) is pre-amplified, digitized, and converted to optical in many current MR coils, but this and coil detuning may use considerable power which is provided electrically. Respective electrical coil connections pose a RF safety problem and thus could be routed carefully (not close too patient or body coil leads, at best parallel to the B0 field) and equipped with thick insulation layers and RF traps, making them bulky and inflexible.

In general, one example generator comprises an acoustic resonator which is excited by the air flow, and a conductive element that oscillates within this resonator with the effect of induction of a voltage by means of an external magnetic field.

In particular, whistles operated with pressurized air at ultrasound frequencies are proposed as such generators. Ultrasound operation makes them inaudible, and the concept avoids any rotating or macroscopically moving parts, respective bearings, and tight tolerances of the turbine concept. This makes them cheaper and more robust. The favorable cooling concept providing exactly as much local cooling power as electrical energy is locally dissipated by all loads is maintained.

As was mentioned above, the energy generated by the adiabatic expansion of a diatomic gas (as air with 79% N2, 20% O2) was given above. With a pressure ratio of 10, to generate 50 W of thermodynamic power at room temperature, a flux of about 0.02 mol/s is needed i.e. about 0.5 l/s of exhaust flow (similar to human breathing action). Overall power consumption of a 16 channel coil array with RXEs may be about 16 W, so that 50 W could be enough to power such a coil also taking typical conversion losses into account.

Several different types of generators that use a resonant cavity may be constructed. They may also have different types of mechanical members that move mechanically in response to resonances in the resonant cavity.

1. A first type of generator is the "blade of grass" or reed type resonator.

In a first example, a generator similar to the whistle represented by a blade of grass is proposed as sketched in FIG. 7 below. Here, the blade (mechanical member 702) is made from a high tensile strength, high yield strength, conductive, and non-ferromagnetic material (e.g. copper-beryllium or copper-cobalt-beryllium as used for conductive springs). Its long axis is oriented perpendicular to the static magnetic field, provided by the MR system. The air flow is oriented parallel to the magnetic field and excites transverse vibrations of the blade. This induces a voltage along the long axis of the blade, which is used to drive an AC current. The blade is designed to have its basic resonance at approximately $f_0$=25 kHz. To limit acoustical losses, it may be located in a cavity with matching acoustic resonance. The width 1 of the cavity may be:

$$l = \frac{\lambda}{2} = \frac{c}{2 f_0}$$

With c=speed of sound, this results in a width of about 7 mm, which is reasonably small for use in MR coils.

The resonance frequency of the blade itself can be controlled by proper choice of its length, thickness, and material properties similar to a guitar string. The basic resonance frequency is given by $$f_0 = \frac{C}{2d} = \frac{1}{2d}\sqrt{\frac{Fd}{m}} = \sqrt{\frac{F}{4 dm}} = \sqrt{\frac{F}{4 d^2 \rho A}} = \sqrt{\frac{\sigma}{4 d^2 \rho}} = \sqrt{\frac{\varepsilon E}{4 d^2 \rho}}$$

With blade length and cross-section d=1 cm and A=1 cm*50 μm, pull force F in the blade, density and elastic modulus of copper beryllium ρ=8250 kg/m 3 and E=130 GPa, a resonance at 25 kHz would use a strain of $$\varepsilon = \frac{4d^2 \rho f_0^2}{E}$$

of only 1.6%, while the elastic range in CuBe and CuCoBe ranges up to 20% depending on the used alloy. Most favorable seems the choice CuCo0.5Be because of its combination of high yield stress and high electric conductivity.

The cross section of the blade may be shaped similar to an aircraft wing profile to minimize turbulence. The blade may also be designed such that one end (windward end or leeward end) is thicker than the other end or strengthened by steel with even higher elastic modulus to make the respective side so rigid that it does not oscillate noticeably. This may result in an additional torsion of the blade and higher resonance frequencies.

Figure 7:
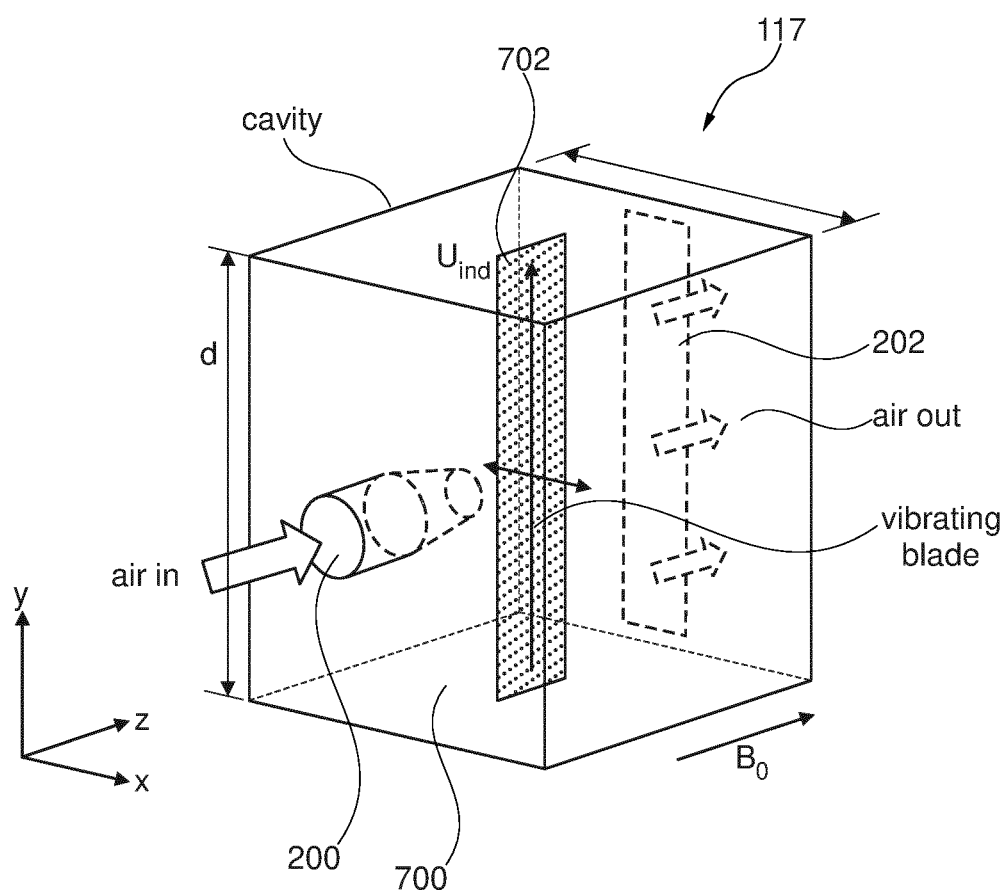
FIG. 7 illustrates a further example of an electrical generator.

FIG. 7 shows a further example of an electrical generator 117. In this example there is again the gas inlet 200 and the gas outlet 202 for pressurized gas. In this example there is a resonant cavity 700. The passage of the pressurized gas causes a resonance which causes a mechanical member 702 to oscillate. This mechanical oscillation of the mechanical member 702 is used to generate electricity. The mechanical member 702 is similar to grass blade or reed. The mechanical member 702 is fixed at top and bottom of the cavity and designed to have a resonance matching that of the cavity. Air flow excites the resonance and induces a voltage $U_{ind}$ by means of the main field $B_0$.

Figure 8:
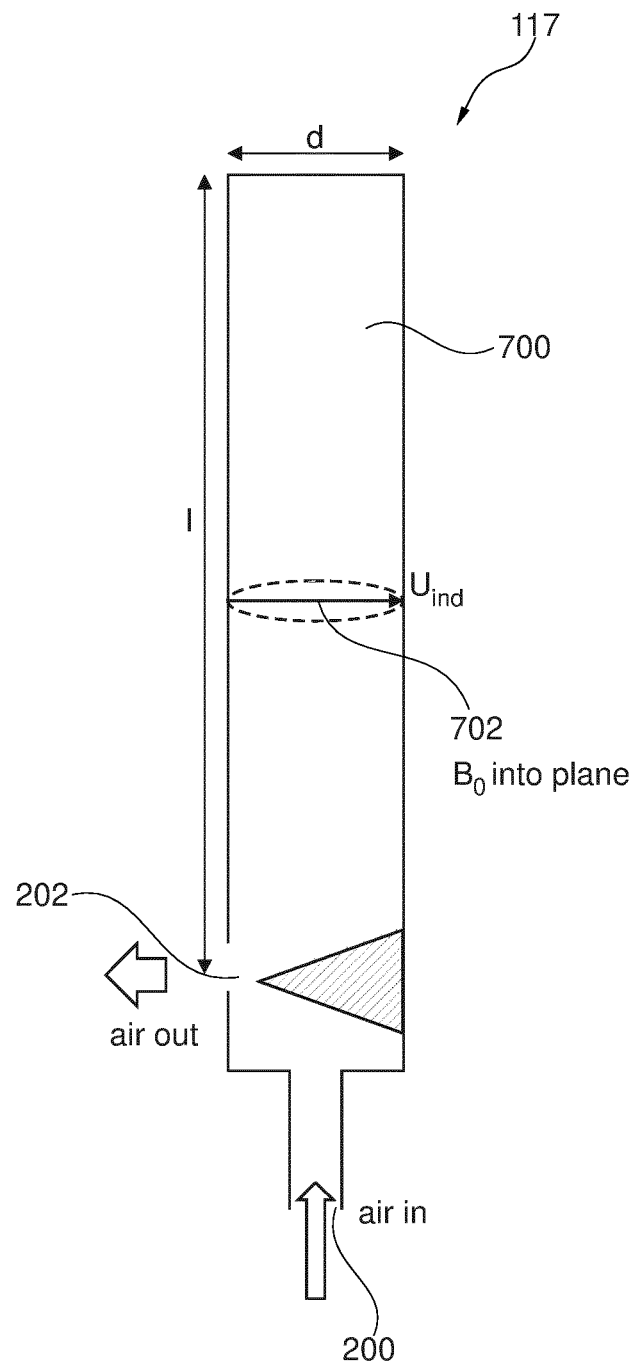
FIG. 8 illustrates a further example of an electrical generator.

Alternatively, the generator may be designed as a pipe or whistle as in FIG. 8 below or variants of it. FIG. 8 shows an alternative structure for the resonant cavity 700. In this structure the electrical generator 117 is constructed similarly to an organ pipe. In this design the pressurized causes resonant oscillations of a column of air in the pipe, which may be transferred to movement of a membrane positioned at the location of largest amplitude of air motion. The external field results in induction of a voltage $U_{ind}$. The generator may also be designed such that the membrane is located at other positions within the, e.g. more towards or at its upper end.

Power generation:
For the grass blade type the amplitude of the blade when oscillating in its basic mode is $$a(y, t) = a_0 \sin\left(\frac{\pi}{d} y\right) \sin(2\pi f_0 t)$$

This results in an induced voltage $$U_{ind} = \int dU = \int_0^d B_0 \dot{a} dy = $$
$$B_0 2\pi f_0 a_0 \sin(2\pi f_0 t) \int_0^d \sin\left(\frac{\pi}{d} y\right) dy = B_0 2\pi f_0 a_0 \sin(2\pi f_0 t) \frac{2d}{\pi}$$

resulting in a maximal voltage of $\hat{U} = B_0 4 d f_0 a_0$
For a blade length of d=1 cm, a frequency $f_0$=25 kHz, a field $B_0$=1.5 T, and an expected transverse oscillation amplitude of $a_0$=1 mm this amounts to a peak voltage of 1.5 V.

The resistance of the blade can be estimated with $$R = \rho \frac{d}{A}$$

and d=1 cm, A=1 cm*50 μm, ρ=8.5E-8 Ωm for CuBe2 as R=1.7 mΩ resulting in a theoretical short circuit power of more than 660 W. This is much more than the available thermodynamic power for reasonable air flows and much less power than required electrically. To derive 16 W of electrical power, an AC current of about I=16 W/1.5 V*sqrt2=16 A through the blade is required, resulting in a thermal dissipation of 0.45 W, which is easily cooled away by the cold air stream.

During the adiabatic expansion, the air cools considerably. If provided at about 300 K with a pressure ration of 10, it cools to roughly 150 K. But when taking all losses into account, there is exactly enough power available to bring the air back to 300 K. So, in case of MR coils, there is no risk for the patient because air is released at ambient temperature. Generally, it is proposed to locate generator at those components which require most cooling (CPUs, GPUs, or RXEs in case of MR coils) and to provide air tubes coprotruded with electrical leads to power and cool further locally adjacent components.

This type of power could be MR imaging compatible. The required AC current of about I=16 A through the blade loop could produce an alternating dipole magnetic field of with following strength at its center, assuming a square loop of 1 cm size:

$$\hat{B} = \frac{2\sqrt{2} \mu_0}{\pi d} \sqrt{2} I = 2.56 \, mT$$

which can be shielded by a copper housing with a thickness of about 2 mm (=5*skin depth) to 0.7% of its original value. Additionally, residual accrued phases of neighboring spins during MR imaging could be rephased within $1/f_0$=40 μs, i.e. typically within a few sampling points. The residual sinusoidal phase modulation of is not phase locked across individual k-space lines, resulting in a locally virtually increased noise level.

Traces of water and CO2 in the feeding air may be removed to avoid any icing of components in the generator by water ice or dry ice. Methods known in the art, e.g. techniques used in industrial liquid air production may be used for this.

Alternatively, or additionally, generators may be regularly rinsed for a short period with low pressure air to remove any ice.

Figure 9:
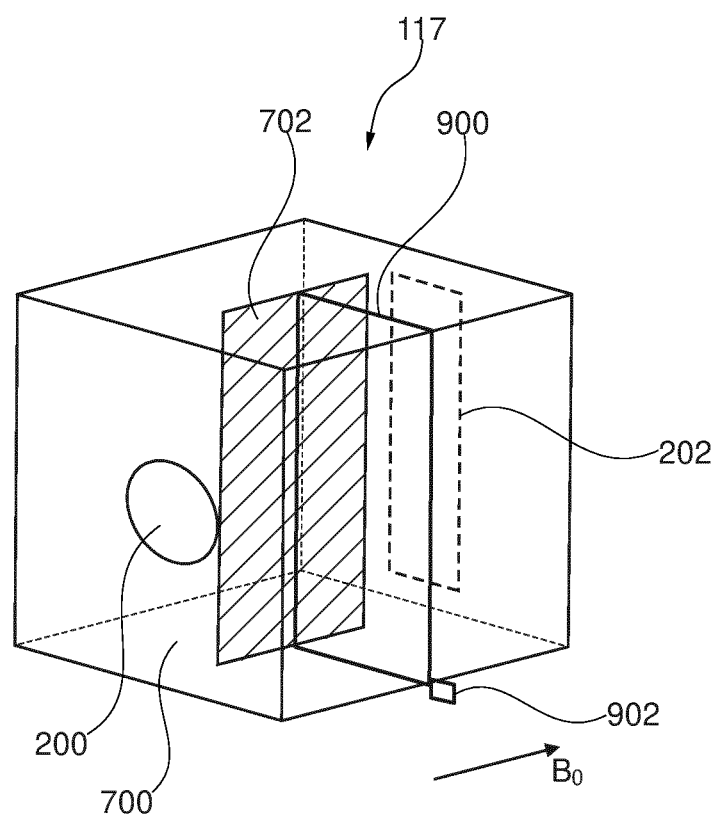
FIG. 9 illustrates a further example of an electrical generator.

FIG. 9 shows a further example of an electrical generator 117 of the style that is depicted in FIG. 7. In this example there is a conductive path 900 that is on part of the walls of the resonant cavity 700 and also along the mechanical member 702. As an acoustic resonance builds up in the resonant cavity 700 the mechanical member 702 could oscillate back and forth and the area encircled by the conductive path 900 could change. This could cause an electrical current in the conductive path 900. In this example there is a rectifying circuit 902 which is used to supply electric power to the radio-frequency system. The rectifying circuit 902 is not shown in all examples but it is understood that if alternating current is supplied by the electrical generator 117 that either within the electrical generator or within the radio-frequency circuit there may be a rectifying circuit 902.

Figure 10:
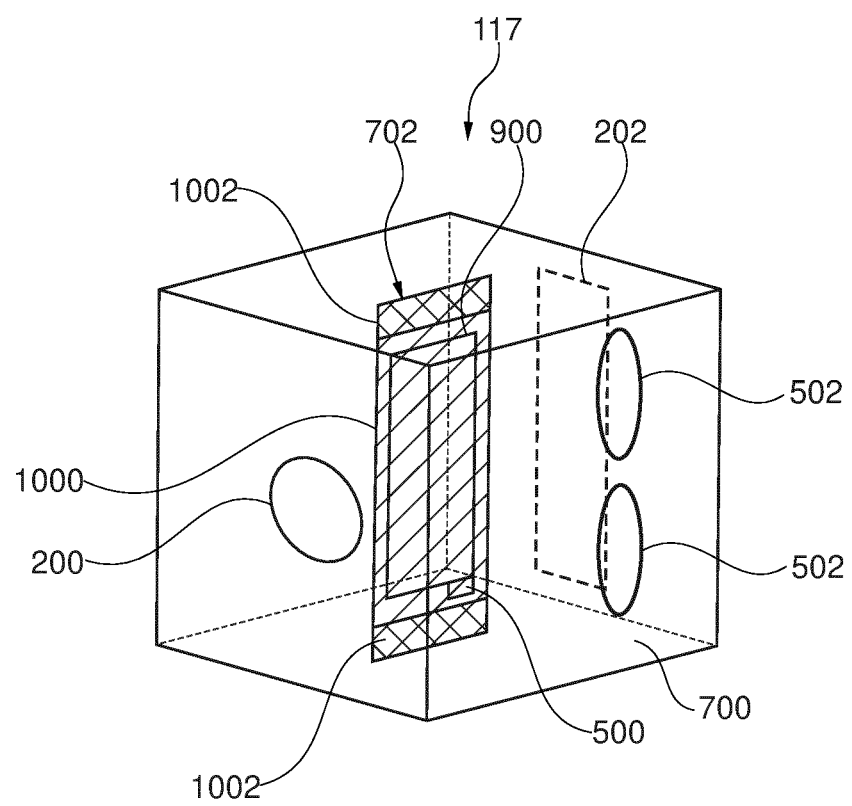
FIG. 10 illustrates a further example of an electrical generator.

FIG. 10 shows a further example of an electrical generator 117. The example in FIG. 10 is similar to the one depicted in FIG. 9 except the conductive path 900 is connected to a switching circuit 500. The mechanical member in this example comprises a conductive portion 1000 with a conductive path 900 that is located entirely on the mechanical member 702. The conductive portion 1000 is attached to the resonant cavity 700 by elastic elements 1002. This design could for example be achieved by forming the mechanical member 702 as a metallic or mostly metallic blade (conductive portion 1000) that could be suspended by an elastic material that has a high durability (elastic elements 1002). Acoustic resonances in the resonant cavity 700 may cause the mechanical member 702 to vibrate. For some designs the elastic elements 1002 may enable the conductive portion 1000 to vibrate with a rotational and/or torsional component. This may facilitate the generation of electricity.

The conductive path supplies power to the switching circuit 500 and then the switching circuit opens and closes the circuit. This may be done at a predetermined frequency and this could cause electromagnetic radiation at the same frequency. Stationary pick-up coils 502 are used to couple to this radio-frequency energy and then are used to provide electricity to the radio-frequency system. This example may be beneficial in that in some cases the mechanical member 702 may wear out. By having the switching circuit 500 the stationary pick-up coils 502 can be on a different mechanical component than the mechanical member 702. This means that the mechanical member 702 can for example be replaced without having to make any modifications to the electronics of the radio-frequency system.

Figure 11:
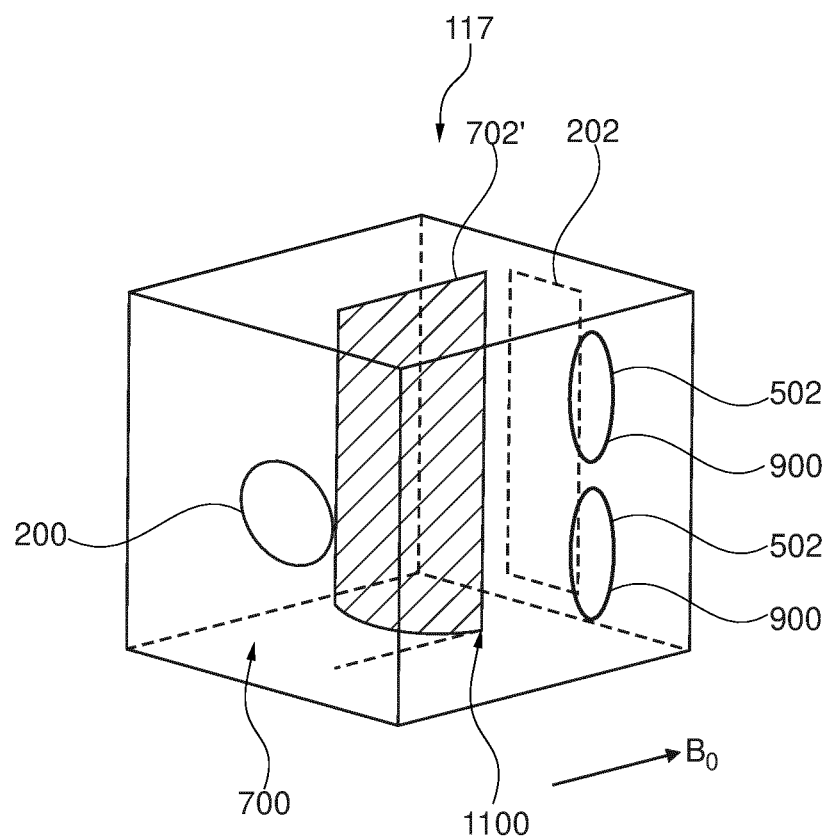
FIG. 11 illustrates a further example of an electrical generator.

FIG. 11 shows a further example of the electrical generator 117. In this example the mechanical member 702' is made at least partially from a conductive material. The mechanical member 702' may for example be made of a conductive material or a partially conductive material. As an acoustic resonance builds up in the resonant cavity 700 the vibrating of the mechanical member 702' back and forth causes eddy currents within the conductive portion of the mechanical member 702'. This causes an electromagnetic field which can be picked up by stationary pick-up coils 502. In this case the stationary pick-up coils are the conductive paths 900. The example of FIG. 11 functions when the mechanical member 702' has a rotational or torsional movement. To get this torsional movement the mechanical member 702' is connected at the top and only connected at one point at the bottom 1100. This enables a portion of the mechanical member 702' to flap back and forth with a rotational or quasi-rotational or torsional movement.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
109 region of interest
110 magnetic field gradient coils
112 magnetic field gradient coil power supply
114 magnetic resonance imaging antenna
115 coil elements
116 radio frequency system
117 electrical generator
118 subject
120 subject support
122 pressurized gas system
124 gas line
125 fiber optic communication system
126 computer system
128 hardware interface
130 processor
132 user interface
134 computer memory
140 machine executable instructions
142 pulse sequence commands
144 magnetic resonance imaging data
146 magnetic resonance image
200 gas inlet
202 gas outlet
204 optional muffler
206 communication system
300 acquire the magnetic resonance imaging data by controlling the magnetic resonance imaging system with the pulse sequence commands
302 power the magnetic resonance imaging coil by controlling the pressurized gas system to supply the pressurized gas during the acquisition of the magnetic resonance imaging data
400 turbine
401 rotor
402 paddles
404 rotational axis
406 conductive loop
500 switching circuit
502 stationary pickup coils
600 conductive plate
700 resonant cavity
702 mechanical member
702' mechanical member
900 conductive path
902 rectifying circuit
1000 conductive portion
1002 elastic element
1100 single point of attachment

The invention claimed is:
1. A magnetic resonance imaging antenna comprising:
one or more coil elements;
a radio frequency system coupled to the one or more coil elements;
a gas inlet configured for receiving a pressurized gas;
a gas outlet configured for venting the pressurized gas; and an electrical generator configured for converting mechanical energy resulting from passing the pressurized gas from the gas inlet to the gas outlet into electricity while in a presence of an external magnetic field, wherein the electrical generator is configured to power the magnetic resonance imaging antenna and components of the magnetic resonance imaging antenna using the electricity wherein the electrical generator comprises a turbine configured for being rotated by the pressurized gas passing from the gas inlet to the gas outlet, wherein the turbine is configured for rotating a conductive element formed as a conductive loop, and the conductive element is configured for generating electricity when being rotated in the external magnetic field, and wherein the electrical generator comprises a switching circuit in series with the conductive loop, wherein the switching circuit is configured for being powered by the switching circuit, wherein the switching circuit is configured for electrically opening and electrically closing the conductive loop at a predetermined frequency, wherein the electrical generator further comprises at least one stationary pickup coil configured for receiving electrical energy switched at the predetermined frequency, wherein the at least one stationary pickup coil is configured for supplying the electricity to the radio frequency system.

2. The magnetic resonance imaging antenna of claim 1, wherein the turbine comprises paddles, and wherein the conductive loop is attached to at least two of the paddles.

3. The magnetic resonance imaging antenna of claim 1, wherein the turbine has a rotational axis, wherein the conductive element is asymmetric about the rotational axis, wherein the electrical generator further comprises at least one stationary pickup coil configured for receiving electrical energy caused by rotation of the conductive element, wherein the at least one stationary pickup coil is configured for supplying the electricity to the radio frequency system.

4. The magnetic resonance imaging antenna of claim 1, wherein any one of the following:
the turbine comprises a rotor, wherein the rotor has a diameter less than 2 mm or less than 1 mm;
the turbine is configured to have a rotational rate of at least 1.2 million rotations per minute; and
combinations thereof.

5. The magnetic resonance imaging antenna claim 1, wherein the electric generator is arranged such that the pressurized gas passing from the gas inlet to the gas outlet cools the radio frequency system.

6. The magnetic resonance imaging antenna of claim 1, wherein:
the radio frequency system comprises a receiver coupled to at least a portion of the one or more coil elements; and
the radio frequency system comprises a transmitter coupled to at least a portion of the one or more coil elements;
the magnetic resonance imaging antenna comprises a fiber optic communication system configured for controlling the radio frequency system; and
a magnetic resonance imaging antenna comprises a wireless communication system configured for controlling the radio frequency system.

7. A magnetic resonance imaging antenna comprising:
one or more coil elements;
a radio frequency system coupled to the one or more coil elements;
a gas inlet configured for receiving a pressurized gas;
a gas outlet configured for venting the pressurized gas; and
an electrical generator configured for converting mechanical energy resulting from passing the pressurized gas from the gas inlet to the gas outlet into electricity while in a presence of an external magnetic field, wherein the electrical generator is configured to power the magnetic resonance imaging antenna and components of the magnetic resonance imaging antenna using the electricity wherein the electrical generator comprises:
a resonant cavity configured for generating acoustic resonances in response to a passage of pressurized gas from the gas inlet to the gas outlet;
a mechanical member configured for vibrating in response to the acoustic resonances, wherein the mechanical member is suspended within the resonant cavity; and
at least one electrically conductive path configured such that movement of the mechanical member causes the generation of the electricity in the external magnetic field.

8. The magnetic resonance imaging antenna of claim 7, wherein the resonant cavity is a whistle tuned to an ultrasonic frequency.

9. The magnetic resonance imaging antenna of claim 7, wherein the mechanical member comprises a conductive element, wherein the conductive element is configured to vibrate torsionally, wherein the at least one conductive path comprises at least one stationary pickup coil configured for receiving electrical energy generated by the vibration of the conductive element, wherein the at least one stationary pickup coil is configured for supplying the electricity to the radio frequency system.

10. The magnetic resonance imaging antenna of claim 7, wherein each of the at least one conductive path is at least partially on the mechanical member.

11. A magnetic resonance imaging system comprising a magnetic resonance imaging antenna, which comprises: one or more coil elements; a radio frequency system coupled to the one or more coil elements; a gas inlet of a magnetic resonance imaging coil configured for receiving a pressurized gas; a gas outlet configured for venting the pressurized gas; an electrical generator configured for converting mechanical energy resulting from passing the pressurized gas from the gas inlet to the gas outlet into electricity while in a presence of an external magnetic field, wherein: the electrical generator is configured to power the magnetic resonance imaging antenna using the electricity; the magnetic resonance imaging system comprises a main magnet; the main magnet is configured for generating the external magnetic field, and wherein the magnetic resonance imaging system further comprise a pressurized gas system for providing pressurized gas to the gas inlet of the magnetic resonance imaging coil,
wherein the magnetic resonance imaging system further comprises:
a processor for controlling the magnetic resonance imaging system; and
a tangible, non-transitory computer readable medium that stores executable instructions and pulse sequence commands configured for controlling the magnetic resonance imaging system to acquire magnetic resonance imaging data using the magnetic resonance imaging antenna, wherein the executable instructions, when executed by the processor cause the processor to:

acquire the magnetic resonance imaging data by controlling the magnetic resonance imaging system with the pulse sequence commands; and power the magnetic resonance imaging coil and components of the magnetic resonance imaging antenna by controlling the pressurized gas system to supply the pressurized gas during acquisition of the magnetic resonance imaging data, wherein the electrical generator comprises a switching circuit in series with a conductive loop, wherein the switching circuit is configured for being powered by the switching circuit, wherein the switching circuit is configured for electrically opening and electrically closing the conductive loop at a predetermined frequency, wherein the electrical generator further comprises at least one stationary pickup coil configured for receiving electrical energy switched at the predetermined frequency, wherein the at least one stationary pickup coil is configured for supplying the electricity to the radio frequency system.

12. The magnetic resonance imaging system of claim 11, wherein the electrical generator comprises a turbine configured for being rotated by the pressurized gas passing from the gas inlet to the gas outlet, wherein the turbine is configured for rotating a conductive element, wherein the conductive element is configured for generating electricity when being rotated in the external magnetic field.

13. The magnetic resonance imaging system of claim 12, wherein the conductive element is a conductive loop.

14. The magnetic resonance imaging system of claim 13, wherein the turbine comprises paddles, and wherein the conductive loop is attached to at least two of the paddles.

15. The magnetic resonance imaging system of claim 12, wherein: the turbine has a rotational axis; the conductive element is asymmetric about the rotational axis; the electrical generator further comprises at least one stationary pickup coil configured for receiving electrical energy caused by rotation of the conductive element; and the at least one stationary pickup coil is configured for supplying the electricity to the radio frequency system.

\* \* \* \* \*